United States Patent [19]

Dayton et al.

[11] Patent Number: 5,075,580

[45] Date of Patent: Dec. 24, 1991

[54] CIRCUIT FOR CONVERTING AN ECL SIGNAL INTO A CMOS SIGNAL

[75] Inventors: Birney D. Dayton, Nevada City; David E. Zimmerman, Grass Valley, both of Calif.

[73] Assignee: NVision, Inc., Nevada City, Calif.

[21] Appl. No.: 578,744

[22] Filed: Sep. 6, 1990

[51] Int. Cl.$^5$ .................. H03K 17/20; H03K 19/175
[52] U.S. Cl. ..................................... 307/475; 307/455
[58] Field of Search ........................ 307/475, 455, 443

[56] References Cited

U.S. PATENT DOCUMENTS

| | | | |
|---|---|---|---|
| 4,536,665 | 8/1985 | Dayton | 307/475 |
| 4,700,087 | 10/1987 | Stroberger | 307/475 |
| 4,883,990 | 11/1989 | Umecki | 307/475 |

*Primary Examiner*—Edward P. Westin
*Assistant Examiner*—Andrew Sanders
*Attorney, Agent, or Firm*—Dellett, Smith-Hill and Bedell

[57] ABSTRACT

A circuit for converting ECL logic level signals to CMOS logic level signals comprises a differential amplifier defining first and second current paths that are connected to a negative reference potential level. When the ECL input signal is logical zero, the first current path is non-conductive and the second path is conductive, and vice versa when the input signal is logical one. A first transistor has its base connected to the first current path, its emitter connected to a positive reference potential level, and its collector connected to the second current path. A second transistor has its base connected to the second current path, its emitter connected to the output terminal, and its collector connected to a ground reference potential level. A pull-up resistor is connected between the collector and emitter of the first transistor. The second current path includes the collector-emitter path of a third transistor, which has its base connected to the ground reference potential level and its collector connected to the base of the second resistor.

7 Claims, 2 Drawing Sheets

CIRCUIT FOR CONVERTING AN ECL SIGNAL INTO A CMOS SIGNAL

BACKGROUND OF THE INVENTION

This invention relates to an improved circuit for converting a balanced logical signal of one polarity into a logical signal of the opposite polarity.

When a digital circuit is implemented using bipolar transistors and emitter-coupled logic (ECL), logical zero is represented by two different negative potential levels (typically $-1.8$ volts and $-0.65$ volts) carried on first and second conductors, whereas logical one is represented by these same potential levels on the second and first conductors respectively. When a digital circuit is implemented using complementary metal-oxide-semiconductor (CMOS) technology, logical zero and logical one are represented by two different positive potential levels, respectively below and above a threshold of 2.5 volts. Typically, logical zero and logical one are represented by 2 volts and 3 volts respectively, and the maximum range is from 0 volts to $+5$ volts.

The ECL system is superior to the CMOS system for transmission of signals over long distances, because the ECL system generates less electromagnetic interference than the TTL system and requires less power to drive a terminated transmission line. (It will be understood that what constitutes a long distance depends on the frequency involved: at gigahertz frequencies, 0.5 cm is a long distance.) On the other hand, a higher level of integration can be achieved with CMOS technology than with circuits that operate in the ECL system. Accordingly, a need exists for a circuit that is capable of converting an ECL logical signal having ECL voltage levels to CMOS voltage levels, so that CMOS components can be used in conjunction with an ECL transmission system.

A known circuit for converting a balanced logical signal of one polarity to a single-ended logical signal of the opposite polarity is disclosed in U.S. Pat. No. 4,536,665 (Dayton). This circuit is shown in FIG. 1 of the accompanying drawings, and its operation is fully described in U.S. Pat. No. 4,536,665.

The circuit disclosed in U.S. Pat. No. 4,536,665 may be used as an ECL to CMOS converter, but it is subject to some disadvantages. When the input signal changes from logical one (P1 at $-0.65$ volts and P2 at $-1.8$ volts) to logical zero, the potential on output conductor P3 initially drops rapidly to a slightly positive voltage (one base-emitter drop minus one Schottky break above ground). However, the potential on conductor P3 then continues to fall, albeit at a reduced rate, as the base-collector capacitance of transistor Q4 and the load capacitance from conductor P3 to ground are charged through resistor R2, so that the final potential level of conductor P3 is about one Schottky break below ground. Further, the increase in the effective base-collector capacitance of transistor Q2 due to the Miller effect lowers the input impedance of transistor Q2 so that the circuit does not have a balanced input impedance. When transistor Q1 is on, its collector is held at a substantially constant level by virtue of the fact that it is connected to the base of transistor Q3, which is connected as a common emitter amplifier. On the other hand, when transistor Q2 is on its collector voltage varies quite widely because the collector of transistor Q2 is connected through resistor R2 to the collector of transistor Q3. As a result, the circuit of FIG. 1 causes differential mode to common mode translation.

SUMMARY OF THE INVENTION

In accordance with the present invention there is provided a circuit having first, second, and third terminals, for receiving a logical input signal having a first state in which the first terminal is at a first potential level, which is negative relative to the second terminal and a ground reference potential level, and a second state in which the first terminal is at a second potential, which is positive relative to the second terminal and is negative relative to the ground reference potential level, and for converting the logical input signal into a logical output signal having a first positive potential level or a second positive potential level, which is more positive than the first positive potential level, at the third terminal depending on whether the input signal is in the first state or the second state. The circuit comprises a switch device defining first and second current paths that are connected to a negative reference potential level, which is more negative than the first potential level. The switch device has a first condition in which the first current path is non-conductive and the second path is conductive, and a second condition in which the first current path is conductive and the second path is non-conductive. The switch device is in the first condition when the logical input signal is in the first state and is in the second condition when the logical input signal is in the second state. A first transistor has its base connected to the first current path and its emitter connected to a positive reference potential level, which is more positive than the second positive potential level, a first resistor is connected between the base and emitter of the first transistor, and a first diode is connected between the base and collector of the first transistor. A second transistor has its base connected to the second current path and its emitter connected to the output terminal and to the collector of the first transistor. The collector of the second transistor is connected to the ground reference potential level and a second resistor is connected between the base of the second transistor and the collector of the first transistor. A second diode has one terminal connected to the base of the second transistor and its other terminal connected to the ground reference potential level. A pull-up resistor is connected between the collector and emitter of the first transistor. The second current path includes the collector-emitter path of a third transistor, which has its base connected to the ground reference potential level and its collector connected to the base of the second resistor.

BRIEF DESCRIPTION OF THE DRAWINGS

For a better understanding of the invention, and to show how the same may be carried into effect, reference will now be made, by way of example, to the accompanying drawings in which.

In the different figures, like reference numerals designate corresponding components.

DETAILED DESCRIPTION

Figure 1:
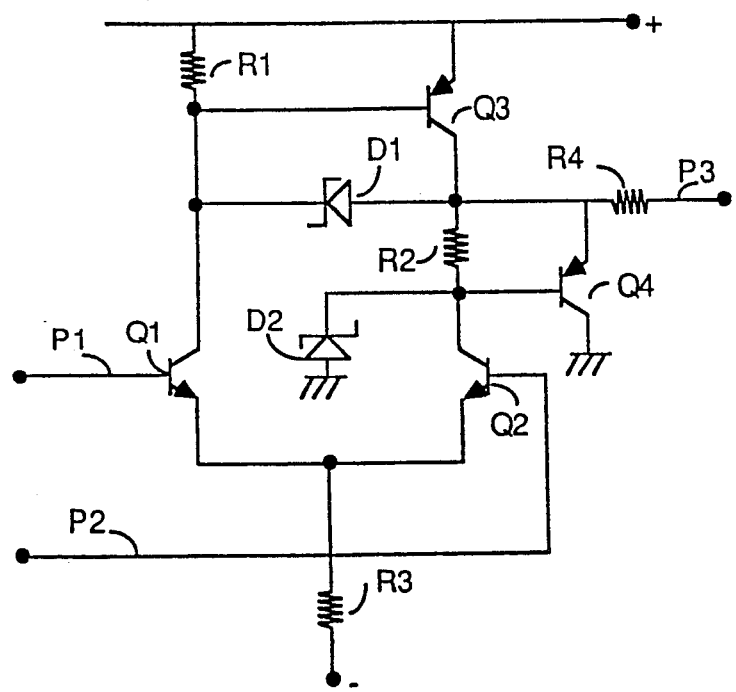
FIG. 1 illustrates schematically a known circuit for translating ECL logic signal levels to CMOS logic signal levels.
Figure 2:
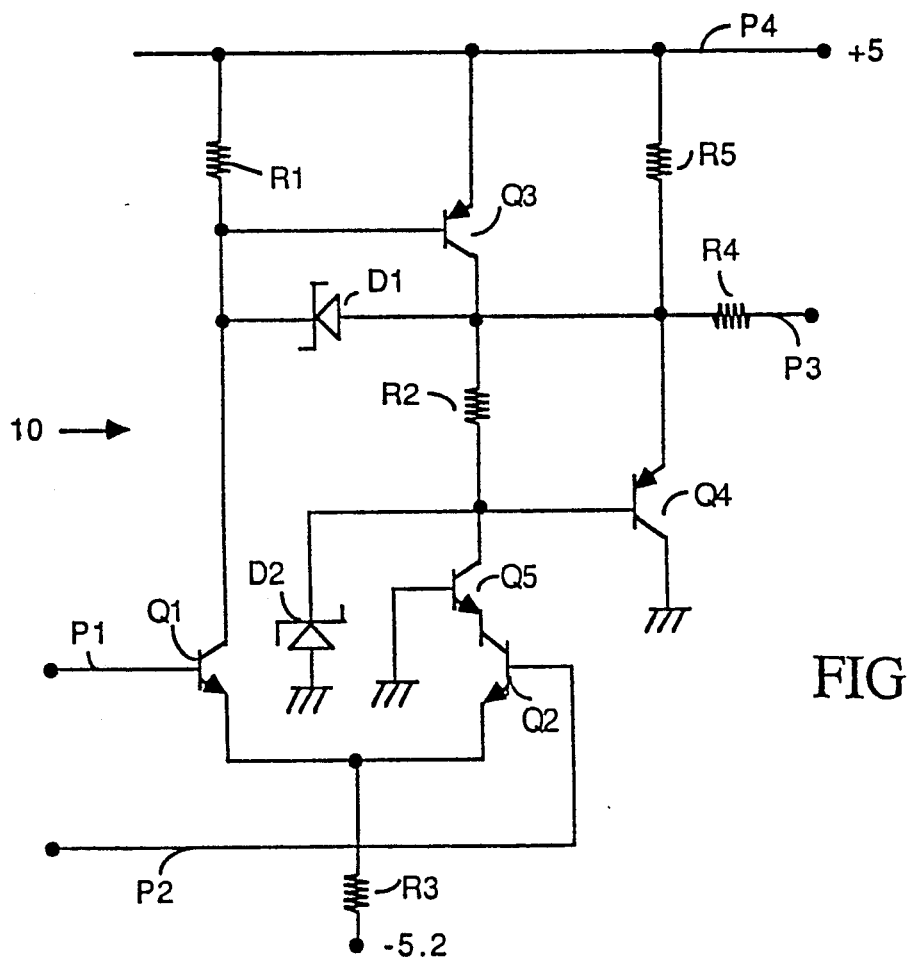
FIG. 2 illustrates schematically an ECL/CMOS translator circuit embodying the invention.

The translator circuit 10 shown in FIG. 2 differs from the circuit shown in FIG. 1 by virtue of there being a pull-up resistor R5 connected between the emitter of transistor Q4 and the positive supply rail P4, and a grounded base or cascode transistor amplifier Q5 having its collector-emitter path connected between the base of transistor Q4 and the collector of transistor Q2.

When the input signal is logical zero, so that transistors Q2 and Q4 are on and transistor Q3 is off, the voltage drop across resistor R2 is equal to the base-emitter voltage of transistor Q4 and the base of transistor Q4 is held at one Schottky break below ground. The current through resistor R5 is substantially equal to the current through resistor R2, and is sufficient to prevent the output conductor P3 from dropping below about 0.3 v.

When transistor Q2 is on, transistor Q5 holds the collector of transistor Q2 one base-emitter drop below ground. Since the collector of transistor Q2 is held at a substantially constant potential, the input impedance of transistor Q2 does not fall and therefore the high frequency input balance of the FIG. 2 circuit is improved with respect to that of the FIG. 1 circuit.

In a preferred implementation, resistors R1 and R2 are each 680 ohms, resistor R3 is 1,000 ohms, resistor R4 is 10 ohms and resistor R5 is 4.7 kohms.

Figure 3:
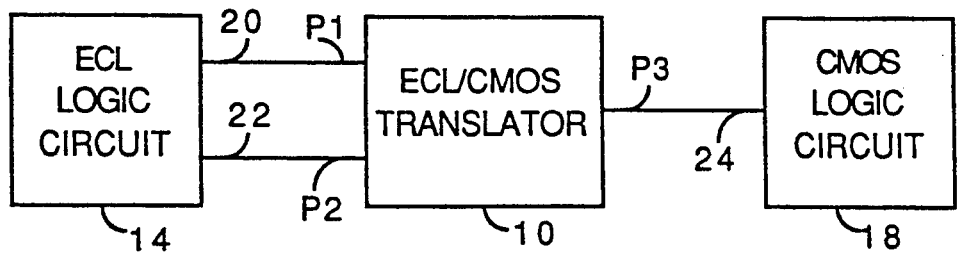
FIG. 3 is a block diagram illustrating use of the FIG. 2 circuit to connect an ECL logic circuit that provides a balanced output signal to a CMOS circuit.

FIG. 3 illustrates in block form an arrangement in which a translator 10 in accordance with FIG. 2 is connected between an ECL logic circuit 14 and a CMOS logic circuit 18, where the ECL logic circuit provides a balanced output signal at terminals 20, 22. The translator circuit 10 converts the ECL logic levels at terminals P1 and P2 to CMOS logic levels at terminal P3, which is connected to the input terminal 24 of CMOS logic circuit 18.

Figure 4:
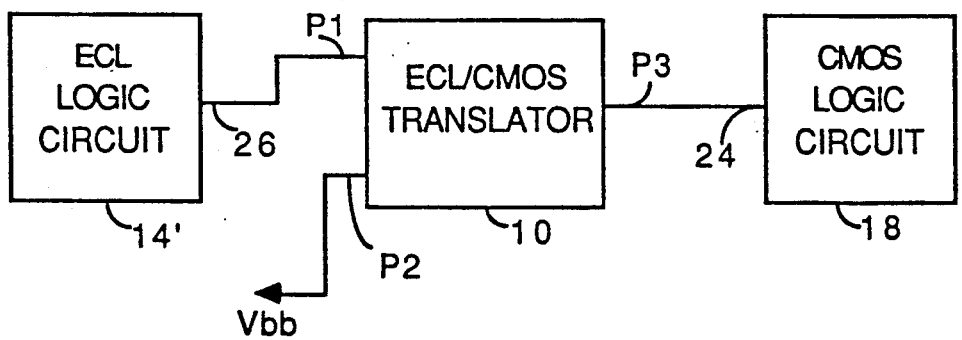
FIG. 4 is a block diagram that illustrates use of the FIG. 2 circuit to connect an ECL logic circuit that provides a single-ended output signal to a CMOS logic circuit.

It is not necessary that the circuit shown in FIG. 2 receive a balanced input signal, since terminal P2, for example, may be connected to Vbb, which is between −1.8 volts and −0.65 volts, and a single-ended ECL logic signal (logical 0 being −1.8 volts and logical 1 being −0.65 volts) applied to terminal P1. The translator circuit then translates the single-ended ECL signal into a CMOS logic level signal. FIG. 4 illustrates in block form an arrangement in which translator circuit 10 connects an ECL logic circuit 14 that provides a single-ended signal at its output terminal 26 to a CMOS logic circuit.

It will be appreciated that the invention is not restricted to the particular embodiment that has been described and illustrated, and that variations may be made therein without departing from the scope of the invention as defined in the appended claims and equivalents thereof.

We claim:

1. A circuit having first, second and third terminals, for receiving a logical input signal having a first state in which the first terminal is at a first potential level, which is negative relative to the second terminal and a ground reference potential level, and a second state in which the first terminal is at a second potential level, which is positive relative to the ground reference potential level, and for converting said logical input signal into a logical output signal having a first or a second positive potential level at said third terminal depending on whether the input signal is in the first state or the second state, said circuit comprising:

a switch device defining two current paths that are connectable to a reference potential level that is more negative than said first potential level, said switch device having a first condition in which one current path is non-conductive and the other current path is conductive, and a second condition in which said one current path is conductive and said other current path is non-conductive, and being in said first condition when the logical input signal is in the first state and in said second condition when the logical input signal is in the second state, a first transistor having its base connected to said one current path, the emitter of said first transistor being connectable to a reference potential level that is more positive than either of said positive potential levels, a first resistor connected between the base and emitter of said first transistor, a first diode connected between the base and collector of said first transistor, a second transistor having its base connected to said other current path and its emitter connected to said output terminal and to the collector of said first transistor, the collector of said second transistor being connectable to a reference potential level intermediate the second negative potential level and the less positive of the two positive potential levels, a second resistor connected between the base of said second transistor and the collector of said first transistor, a second diode having one terminal connected to the base of said second transistor and having its other terminal connectable to a reference potential level intermediate the second negative potential level and the less positive of the two positive potential levels, and a pull-up resistor connected between the collector and emitter of said first transistor and wherein said other current path includes the collector-emitter path of a third transistor having its base connectable to a reference potential level intermediate the second negative potential level and the less positive of the two positive potential levels and its collector connected to the base of the second transistor.

2. A circuit according to claim 1, wherein said switch device comprises a pair of transistors providing the two current paths respectively, one transistor of the pair having its base connected to said first terminal and its collector connected to the base of said first transistor and the other transistor of the pair having its base connected to said second terminal and its collector coupled to the base of said second transistor, the emitters of the pair of transistors being connected to one end of a third resistor, which is connectable at its other end to the negative reference potential level, and wherein said third transistor has its emitter connected to the collector of said other transistor of the pair.

3. A circuit having first, second and third terminals, for receiving a logical input signal having a first state in which the first terminal is at a first potential level, which is negative relative to the second terminal and a ground reference potential level, and a second state in which the first terminal is at a second potential, which is positive relative to the second terminal and is negative relative to the ground reference potential level, and for converting said logical input signal into a logical output signal having a first or a second positive potential level at said third terminal depending on whether the input signal is in the first state or the second state, said circuit comprising:

a switch device defining two current paths that are connectable to a reference potential level that is more negative than said first potential level, said switch device having a first condition in which one current path is non-conductive and the other current path is conductive, and a second condition in which said one current path is conductive and said other current path is non-conductive, and being in said first condition when the logical input signal is in the first state and in said second condition when the logical input signal is in the second state, a first transistor having its base connected to said one current path, the emitter of said first transistor being connectable to a reference potential level that is more positive than either of said positive potential levels, a first resistor connected between the base and emitter of said first transistor, a first diode connected between the base and collector of said first transistor, a second transistor having its base connected to said other current path and its emitter connected to said output terminal and to the collector of said first transistor, the collector of said second transistor being connectable to a reference potential level intermediate the second negative potential level and the less positive of the two positive potential levels, a second resistor connected between the base of said second transistor and the collector of said first transistor, a second diode having one terminal connected to the base of said second transistor and having its other terminal connectable to a reference potential level intermediate the second negative potential level and the less positive of the two positive potential levels, and a third transistor whose collector-emitter path is part of said other current path, said third transistor having its base connectable to a reference potential level intermediate the second negative potential level and the less positive of the two positive potential levels and its collector connected to the base of the second transistor.

4. A circuit according to claim 3, wherein said switch device comprises a pair of transistors providing the two current paths respectively, one transistor of the pair having its base connected to said first terminal and its collector connected to the base of said first transistor and the other transistor of the pair having its base connected to said second terminal and its collector coupled to the base of said second transistor, the emitters of the pair of transistors being connected to one end of a third resistor, which is connectable at its other end to the negative reference potential level.

5. A circuit according to claim 4, wherein the emitter of said third transistor is connected to the collector of said other transistor of the pair.

6. In combination, a first logic circuit having at least one output terminal and providing a logical output signal having a first state in which its output terminal is at a first negative potential level relative to a ground reference potential level and a second state in which its output terminal is at a second negative potential level, which is less negative than said first negative potential level, a second logical circuit having an input terminal and being responsive to a logical input signal having a first state in which the input terminal is at a first positive potential level and a second state in which the input terminal is at a second positive potential level, and a translator circuit having a first terminal connected to said output terminal of the first logic circuit, a second terminal connected to the input terminal of the second logic circuit, and a third terminal, said translator circuit comprising:

a switch device defining two current paths that are connectable to a reference potential level that is more negative than said first negative potential level, said switch device having a first condition in which one current path is conductive and the other current path is non-conductive, and a second condition in which said one current path is non-conductive and said other current path is conductive, and being in said first condition when the first terminal is at the first negative potential level and the third terminal is at a negative potential that is less negative than the first negative potential level and in said second condition when the first terminal is at the second negative potential level and the third terminal is at a negative potential that is more negative than the second negative potential level, a first transistor having its base connected to said one current path, the emitter of said first transistor being connectable to a reference potential level that is more positive than either of said positive potential levels, a first resistor connected between the base and emitter of said first transistor, a first diode connected between the base and collector of said first transistor, a second transistor having its base connected to said other current path and its emitter connected to said output terminal and to the collector of said first transistor, the collector of said second transistor being connectable to a reference potential level intermediate the second negative potential level and the less positive of the two positive potential levels, a second resistor connected between the base of said second transistor and the collector of said first transistor, a second diode having one terminal connected to the base of said second transistor and having its other terminal connectable to a reference potential level intermediate the second negative potential level and the less positive of the two positive potential levels, and a pull-up resistor connected between the collector and the emitter of said first transistor and wherein said other current path includes the collector-emitter path of a third transistor having its base connectable to a reference potential level intermediate the second negative potential level and the less positive of the two positive potential levels and its collector connected to the base of the second transistor.

7. In combination, a first logic circuit having at least one output terminal and providing a logical output signal having a first state in which its output terminal is at a first negative potential level relative to a ground reference potential level and a second state in which its output terminal is at a second negative potential level, which is less negative than said first negative potential level, a second logical circuit having an input terminal and being responsive to a logical input signal having a first state in which the input terminal is at a first positive potential level and a second state in which the input terminal is at a second positive potential level, and a translator circuit having a first terminal connected to said output terminal of the first logic circuit, a second terminal connected to the input terminal of the second logic circuit, and a third terminal, said translator circuit comprising:

- a switch device defining two current paths that are connectable to a reference potential level that is more negative than said first negative potential level, said switch device having a first condition in which one current path is conductive and the other current path is non-conductive, and a second condition in which said one current path is non-conductive and said other current path is conductive, and being in said first condition when the first terminal is at the first negative potential level and the third terminal is at a negative potential that is less negative than the first negative potential level and in said second condition when the first terminal is at the second negative potential level and the third terminal is at a negative potential that is more negative than the second negative potential level,
- a first transistor having its base connected to said one current path, the emitter of said first transistor being connectable to a reference potential level that is more positive than either of said positive potential levels,
- a first resistor connected between the base and emitter of said first transistor,
- a first diode connected between the base and collector of said first transistor,
- a second transistor having its base connected to said other current path and its emitter connected to said output terminal and to the collector of said first transistor, the collector of said second transistor being connectable to a reference potential level intermediate the second negative potential level and the less positive of the two positive potential levels,
- a second resistor connected between the base of said second transistor and the collector of said first transistor,
- a second diode having one terminal connected to the base of said second transistor and having its other terminal connectable to a reference potential level intermediate the second negative potential level and the less positive of the two positive potential levels, and
- a third transistor whose collector-emitter path is part of said other current path, said third transistor having its base connectable to a reference potential level intermediate the second negative potential level and the less positive of the two positive potential levels and its collector connected to the base of the second transistor.

* * * * *